Figure 1:
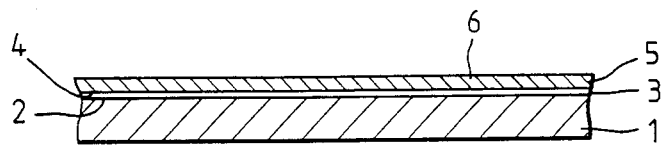

United States Patent [19]

Butters et al.

[11] Patent Number: 4,985,301

[45] Date of Patent: Jan. 15, 1991

[54] ASSEMBLY FOR USE IN MAKING A PRINTING PLATE

[75] Inventors: Alan Butters, Suffolk; Roger N. Barker, Essex, both of England

[73] Assignee: Imperial Chemical Industries, plc, London, England

[21] Appl. No.: 518,757

[22] Filed: Jul. 29, 1983

[30] Foreign Application Priority Data

Aug. 11, 1982 [GB] United Kingdom ............... 8223138

[51] Int. Cl.⁵ .................. B32B 27/30; B32B 27/08; G03C 1/80; B41N 1/12
[52] U.S. Cl. .................................. 428/336; 428/483; 428/518; 430/272; 430/306; 430/930; 101/395; 101/401.1
[58] Field of Search ............ 430/930, 306, 272, 14, 430/18; 101/395, 401.1; 428/518, 483, 336

[56] References Cited

U.S. PATENT DOCUMENTS

| | | | |
|---|---|---|---|
| 3,993,501 | 11/1976 | Kalnoki-Kis | 429/48 |
| 4,087,579 | 5/1978 | Newman | 428/336 X |
| 4,289,843 | 9/1981 | Boutle et al. | 430/306 X |

FOREIGN PATENT DOCUMENTS

| | | |
|---|---|---|
| 1321108 | 6/1973 | United Kingdom . |
| 1507660 | 3/1978 | United Kingdom . |
| 2034492 | 6/1980 | United Kingdom ............... 101/395 |

OTHER PUBLICATIONS

*Hackh's Chemical Dictionary* (3rd ed.), Julius Grant, editor, McGraw-Hill Book Company, Inc., New York, N.Y., 1944.

H. Bennett, ed. "mer" and terpolymer in *Concise Chemical and Technical Dictionary*, 3rd ed., Chemical Publishing Company, Inc., New York, N.Y., 1974, pp. 661 and 1023.

*Primary Examiner*—John E. Kittle
*Assistant Examiner*—Cynthia Hamilton
*Attorney, Agent, or Firm*—Cushman, Darby & Cushman

[57] ABSTRACT

An assembly for use in the production of a relief printing plate comprises a polymeric substrate, a primer layer and a resin layer thereon, the resin layer being at least 2 microns thick and comprising a low molecular weight copolymer of vinyl chloride and vinyl acetate, optionally with a termonomer, particularly a hydroxyl-containing termonomer. The primer layer may contain a vinyl chloride-vinyl acetate copolymer, and the substrate may be a polyester, particularly a polyethylene terephthalate film.

4 Claims, 1 Drawing Sheet

ASSEMBLY FOR USE IN MAKING A PRINTING PLATE

The present invention relates to an assembly which is adapted to receive a photopolymerisable material to produce a relief printing plate.

A relief printing plate consists essentially of a photopolymerisable material mounted on a suitable substrate. In use the photopolymerisable material is irradiated with actinic e.g. ultraviolet light through which an image-bearing transparency e.g. a photographic negative film, whereby the exposed portion representing the image is hardened and the non-exposed portion is subsequently removed e.g. by solvent washing. In more detail, the process of plate production involves irradiating the plate from opposite sides to effect simultaneous exposure of the back of the plate and the image on the front, followed by removal of unpolymerised material and final curing of the plate by further irradiation.

One important factor in the construction of such a relief printing plate is the adhesion of the photopolymerisable material to the substrate. Thus, after irradiation the photopolymerisable material should not tend to peel from the substrate nor should parts of the image slide on the substrate as a result of handling the plate after the "wash-out" process both before and after final curing irradiation because in such a case the relief plate will not provide a true representation of the transparency. Another desirable property in the assembly is flatness, i.e. on lying flat there should be no curling of the edges.

In order to achieve satisfactory adhesion between the substrate and the photopolymerisable material it has proved necessary to pre-treat the substrate with one or more layers of substances capable of providing a keying effect between the substrate and the photopolymerisable material. Such substances are generally applied to the substrate in layers a few microns thick to give an assembly which is then adapted to receive the photopolymerisable material.

The present invention is a new assembly of this type which confers an excellent resistance to peel on a variety of photopolymerisable materials and at the same time has a reduced tendency to curl.

Accordingly, the invention comprises an assembly adapted to receive a photopolymerisable material in the production of a relief printing plate which comprises
(a) a polymeric substrate
(b) a priming layer on the substrate, and
(c) a resin layer on the priming layer, wherein the resin layer is at least 2 microns thick and preferably at least 6 microns thick and comprises a resin which is vinyl chloride/vinyl acetate copolymer of average molecular weight in the range 1,000 to 100,000 preferably 5,000 to 25,000 and which contains 60 to 98 wt% vinyl chloride, 2 to 20 wt% vinyl acetate and, optionally, up to 20 wt% of a termonomer.

The vinyl chloride-vinyl acetate copolymer resin is a relatively low molecular weight material, and the average molecular weight (number average) thereof is more preferably in the range 6,000 to 16,000, especially 6,000 to 10,000.

The termonomer, when present, preferably amounts to 10 to 20% especially 15% by weight of the resin polymer and may be an ethylenically unsaturated monomer, such as maleic acid or, notionally, vinyl alcohol produced by hydrolysing a proportion of the vinyl acetate units in the polymer chain but is preferably a hydroxyl group-containing ethylenically unsaturated termonomer such as a hydroxyl-containing alkyl acrylate or methacrylate, particularly a lower alkyl acrylate or methacrylate in which the alkyl group contains from 1 to 6 carbon atoms—especially a methyl or ethyl group.

When a hydroxyl-containing termonomer is present, the total hydroxyl content, based on the weight of the terpolymer, is desirably from 1.5 to 2.5 wt%, particularly from 1.8 to 2.2, e.g. 2.0, wt%.

A preferred resin comprises a terpolymer containing from 75 to 85 weight % of vinyl chloride, from 2 to 8 weight % of vinyl acetate and the balance (to 100 weight %) of an unsaturated termonomer.

It is also desirable to incorporate a filler, especially a particulate filler, into the resin layer in order to roughen the surface and for this purpose particulate oxides of metals or metalloids, such as alumina and silica, especially the latter, have proved to be very satisfactory.

The resin layer is at least 2 microns, preferably at least 6 microns thick and is more preferably about 12 microns thick. There is no upper limit to the thickness of the layer from the point of view of optimum anti-peel properties of the assembly but for practical and economic reasons there is no cause to apply a resin layer greatly exceeding 30 microns.

The substrate may comprise any suitable polymeric material, particularly in the form of a self supporting film or sheet. Suitable polymeric materials include cellulose esters, e.g. cellulose acetate, polystyrene, polyamides, polymers and copolymers of vinyl chloride, polymers and copolymers of olefines, e.g. polypropylene, polysulphones and particularly linear polyesters which may be obtained by condensing one or more dicarboxylic acids or their lower alkyl diesters, e.g. terephthalic acid, isophthalic, phthalic, 2,5-, 2,6- and 2,7-naphthalene dicarboxylic acid, succinic acid, sebacic acid, adipic acid, azelaic acid, diphenyl dicarboxylic acid, and hexahydroterephthalic acid or bis-p-carboxyl phenoxy ethane, optionally with a mono-carboxylic acid, such as pivalic acid, with one or more glycols, e.g. ethylene glycol, 1,3-propanediol, 1,4-butanediol, neopentyl glycol and 1,4-cyclohexane-dimethanol. A biaxially oriented and heat-set film of polyethylene terephthalate is particularly useful for the production of an assembly according to the invention and may be produced by any of the processes known in the art, e.g. as described in British patent specification 838,708.

The polymer substrate is suitably from 50 to 3,000, particularly from 50 to 300 especially from 100 to 175 microns thick.

The priming layer is achieved by treating the surface of the polymeric substrate with an agent having a solvent or swelling action on the substrate polymer which is known in the art for this purpose. Examples of such agents, which are particularly suitable for the treatment of polyester substrates, are halogenated phenols dissolved in common organic solvents e.g. a solution of p-chloro-metacresol, 2,4-dichlorophenol, 2,4,5, or 2,4,6-trichlorophenol or 4-chlororesorcinol in acetone or methanol. In addition, and preferably, the priming solution may contain a partially hydrolysed vinyl chloride/vinyl acetate copolymer such as has been described for use in the resin layer, particularly a copolymer containing 0.5 to 3 wt% hydroxyl units. The molecular weight of this polymer is preferably greater than that of the vinyl chloride-vinyl acetate copolymer comprising the resin layer, and suitably lies in the range of from 10,000 to 30,000 but is preferably from 16,500 to 25,000. The thickness of the priming layer is however considerably less than that of the subsequent resin layer being at most less than 2 microns, and usually less than 1 micron, thick.

An optional yet preferred feature of the assembly according to the invention is the incorporation of a photoinitiator. The photoinitiator may be included in the resin layer, but preferably is deposited as a further layer superimposed on the resin layer. The Photoinitiator has the function of accelerating the polymerisation of the photopolymerisable material when it is irradiated after being applied to the assembly. A wide range of photoinitiators may be used for this purpose e.g. benzoin, a benzoin alkyl ether such as benzoin methyl-, ethyl-, or isopropyl-ether, alpha-methyl- benzoin, benzil, substituted benzils such as p-nitro and p-methoxyl-benzil, biacetyl, fluorenone, anthraquinone, phenanthraquinone, camphorquinone, diphenyl disulphide, 2-napthalene-sulphonyl chloride, omega-bromoacetophenone, eosin, thionin, chloro- or alkyl-substituted thioxanthone, dibenzosuberone, or alkyl esters of dialkylamino- benzoic acid.

As with the priming layer, the resin layer and photoinitiator, if applied as an independent layer, may conveniently be applied in solution, the solvent being evaporated to leave behind the resin or photoinitiator. The common organic solvents are used for this purpose e.g. acetone, methyl-ethylketone, methanol and chlorinated solvents such as methylene chloride and 1,1,1-trichloroethane.

The invention is illustrated by reference to the accompanying drawings in which

Figure 2:
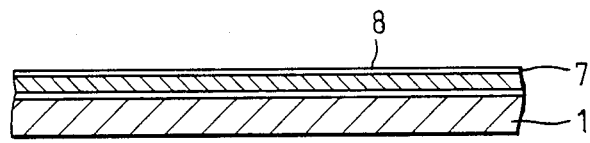
Figure 3:
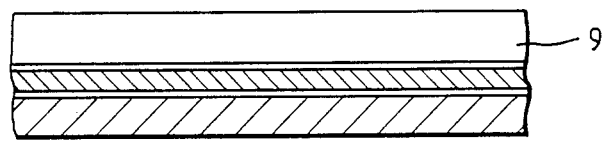
Figure 4:
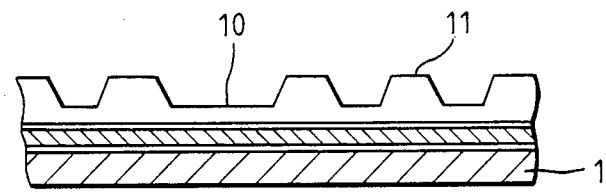

FIG. 1 is a fragmentary, schematic, cross-sectional elevation (not to scale) of an assembly comprising a substrate, primer and resin layer, FIG. 2 is a similar assembly including a further photoinitiator layer, FIG. 3 is a similar assembly including a further photopolymerisable layer, and FIG. 4 is a schematic cross-sectional elevation of a portion of a relief printing plate.

Referring to the drawings, a substrate layer 1, such as a biaxially oriented, polyethylene terephthalate film, is provided on a surface 2 thereof with a priming layer 3. On surface 4 of the priming layer is provided a resin layer 5.

In FIG. 2, a photoinitiator layer 7 has been deposited on surface 6 of the resin layer.

In FIG. 3, a photopolymerisable layer 9 has been deposited on surface 8 of the photoinitiator layer, and in FIG. 4 the assembly of FIG. 3 has been exposed to ultra-violet light through a pattern mask (not shown), and washed in a suitable solvent to remove unpolymerised regions of layer 9, thereby providing a printing plate with recesses 10 and relief regions 11.

The invention is further illustrated by reference to the following Examples in which a range of assemblies were made and tested.

EXAMPLES 1-13

The substrate used in every case was polyethylene terephthalate of 100 microns thickness (MELINEX 0 Grade, MELINEX is a registered trademark). The priming layer applied was an acetone solution of p-chlorometacresol (3.75% weight/vol) and VINYLITE VAGH (0.75% weight/vol), VINYLITE VAGH is a copolymer of vinylchloride (90 wt %) and vinyl acetate (4 wt %) with 2.3 wt % hydroxyl content and of average molecular weight 23,000. After coating the acetone was removed by heating at 100° C. for 1 min leaving a priming layer of less than 1 micron thickness applied to the substrate.

Following the application of the priming layer the substrate was next coated with various resins to give assemblies in accordance with the invention or, by using resins other than vinyl chloride/vinyl acetate copolymers to give assemblies characteristic of those used in the prior art. Typically, the coating solution was a solution in methylethyl ketone of VINYLITE VROH (45% wt/vol). VINYLITE VROH is a terpolymer of vinyl chloride (81 wt%), vinyl acetate (4 wt %), and a hydroxyl-containing alkylacrylate, with a total hydroxyl content of 2.0% by weight of the terpolymer, and an average molecular weight of 8,000. The coating solution also contained 2% wt/wt of a silica filler (GASIL EBN) and had a viscosity of 1 to 2 poise. The solvent was finally removed from the substrate by heating at 80° to 90° C. with impingement of air for 20 seconds leaving a resin coating on the substrate of thickness 11 microns.

In some of the Examples a third, photoinitiator layer was also applied from 1,1,1-trichloroethane by a similar method to the resin layer, drying being carried out at 80°-90° C. for 7 minutes. The photoinitiators used were 2-isopropyl-9H-thioxanthene-9-one. (QUANTACURE ITX) or a mixture of isopropyl-benzion ether and p-dimethyl-aminobenzaldehyde.

Scratch Peel Test

The experimental assemblies were tested by first scratching to give a number of approximately parallel scratches of one inch spacing and then coating with a commercial photopolymerisable material manufactured by Hercules Inc and known as FFFW to give a photopolymerisable layer of approximately 40 microns thickness. Test assembly was then also applied to the free surface of the photopolymerisable material so that the latter formed the center of a sandwich with the scratched coated side of the assembly in contact with the two surfaces of the photopolymerisable material.

The sandwich was next placed flat on a glass plate and illuminated through the plate by means of a battery of six Thorn UV lamps at an intensity of 800 micro watts/sqcm for 30 seconds. The sandwich was then turned over and the other side illuminated at 3,000-4,000 microwatts/sqcm for 12 minutes.

The cured test sandwich was then tested for its adhesive strength by placing it in the jaws of an INSTRON Tensile Tester and pulling the sandwich apart, the peeling action being across the scratch marks at a peel rate of 5cm/minute. The weight at which delamination occurred was recorded and the results are given in the following Table.

TABLE 1

| Example | Priming layer | Resin layer | Resin layer Thickness | Photoinitiator layer | Peel (lbs/inch) |
|---|---|---|---|---|---|
| 1 | p-chorometacresol + VINYLITE VAGH | VINYLITE VROH + GASIL EBN | 11 microns | QUANTACURE ITX | 7.7 |
| 2 | p-chorometacresol + VINYLITE VAGH | VINYLITE VROH + GASIL EBN | " | — | 5.5 |
| 3 | p-chorometacresol + VINYLITE VAGH | VINYLITE VROH | 5 | — | 3.3 |
| 4 | p-chorometacresol + VINYLITE VAGH | VINYLITE VAGH | 5 | — | 0.8 |
| 5 | p-chorometacresol + VINYLITE VAGH | Cellulose Acetate propionate | 6 | Isopropylbenzoinether + p-Dimethylamino benzaldehyde | 0.7 |
| 6 | p-chorometacresol + VINYLITE VAGH | Polyester Urethane + isopopylbenzoinether | 6 | — | 1.0 |
| 7 | p-chorometacresol + VINYLITE VAGH | Polyvinylacetal | 6 | — | 1.0 |
| 8 | p-chorometacresol + VINYLITE VAGH | Ethyl cellulose | 6 | — | 1.0 |
| 9 | p-chorometacresol + VINYLITE VAGH | Polybutadiene | 6 | — | 1.0 |
| 10 | p-chorometacresol + VINYLITE VAGH | Polyamide | 6 | — | 1.0 |
| 11 | p-chorometacresol + VINYLITE VAGH | Polyethyene terephthalate | 6 | — | 1.0 |
| 12 | p-chorometacresol + VINYLITE VAGH | Polyvinyl pyrrolidone | 6 | — | 1.0 |
| 13 | p-chorometacresol + VINYLITE VAGH | Ethylene/vinyl acetate copolymer | 6 | — | 1.0 |

EXAMPLES 14–18

The test was repeated using the assembly defined in Example 1 but using different photopolymers. In this instance the test assembly coated with the photopolymer was compared with a commercial assembly coated with the same photopolymer. The results are given in the following Table.

TABLE 2

| | | | Peel lbs/inch | |
|---|---|---|---|---|
| Example | Photopolymer | Manufacturer | Assembly according to Example 1 | Commercial Assembly |
| 14 | LR 14 OD | Hercules | 9.2 | 8.4 |
| 15 | F41 | Asahi | 5.7 | 4.8 |
| 16 | F32 | Asahi | 3.7 | 0.4 |
| 17 | FW 140 | Hercules | 8.8 | 0.2 |
| 18 | FWO 35 | Hercules | 7.0 | 6.2 |

EXAMPLE 19

Curl Test

In this test an assembly according to Example 1 which had been stored flat in a stack of sheets for several weeks was compared with a commercial assembly with a similar storage history. The samples were allowed to lie flat for six hours under atmospheric conditions of 20° C. and 60% relative humidity. The lift of the edge of the sheet was then recorded. The following figures are for millimeters lift of an A4 size sheet of substrate thickness 100 microns.

| Assembly according to Example 1 | 5 |
|---|---|
| Commercial assembly | 8 |

EXAMPLES 20–27

After an interval of several months the procedure of Example 1 was repeated using a variety of resin layers. Details of the formulations and test results are provided in the accompanying Table 3.

TABLE 3

| | | | Resin Layer thickness (microns) | Photoinitiator Layer | Adhesion | |
|---|---|---|---|---|---|---|
| Example | Priming Layer | Resin Layer | | | Peel (lbs/in) | Mode of Failure |
| 20 | p-chlorometacresol + VAGH VINYLITE | VINYLITE VROH + GASIL EBN | 11 | QUANTACURE ITX | 7.9 | ppc |
| 21 | p-chlorometacresol + VAGH VINYLITE | VINYLITE VROH + GASIL EBN | 11 | None | 4.4 | ppc |
| 22 | p-chlorometacresol + VAGH VINYLITE | VINYLITE VROH + GASIL EBN | 5 | QUANTACURE ITX | 2.2 | b |
| 23 | p-chlorometacresol + VAGH VINYLITE | VINYLITE VROH + GASIL EBN | 5 | None | 1.3 | b |
| 24 | p-chlorometacresol + VAGH VINYLITE | VINYLITE VAGH + GASIL EBN | 11 | QUANTACURE ITX | 1.3 | b |
| 25 | p-chlorometacresol + VAGH VINYLITE | VINYLITE VAGH + GASIL EBN | 5 | " | 1.5 | b |
| 26 | p-chlorometacresol + | VINYLITE VROH | 11 | " | 7.7 | ppc |

TABLE 3-continued

| Example | Priming Layer | Resin Layer | Resin Layer thickness (microns) | Photoinitiator Layer | Adhesion Peel (lbs/in) | Adhesion Mode of Failure |
|---|---|---|---|---|---|---|
| 27 | VAGH VINYLITE p-chlorometacresol + VAGH VINYLITE | VINYLITE VROH | 5 | " | 2.2 | b | ppc = photopolymer cohesion
b = adhesion to base

Comparison of the results obtained in Examples 20 and 21 with those of Examples 1 and 2 respectively illustrates the excellent reproducibility of the system when repeated after an interval of time.

The data in Table 3 also demonstrate that peel strength depends on the thickness of the resin layer, that the low molecular weight resin VINYLITE VROH yields peel strengths superior to those obtained with the higher molecular weight VINYLITE VAGH resin, that the inclusion of particulate silica does not adversely affect the peel strength conferred by VINYLITE VROH resin, and that peel strength is increased by the provision of a further photoinitiator layer containing QUANTACURE ITX.

We claim:

1. An assembly adapted to receive a photopolymerizable material in the production of a relief printing plate which comprises (a) a polymeric substrate, (b) a priming layer on the substrate and (c) a resin layer on the priming layer, wherein the resin layer is at least 2 microns thick and comprises a terpolymer resin of average molecular weight in the range 1,000 to 100,000 and which contains 75 to 85 weight % vinyl chloride, 2 to 8 weight % vinyl acetate and the balance of an unsaturated termonomer.

2. An assembly adapted to receive a photopolymerizable material in the production of a relief printing plate which comprises
   (a) a polymeric substrate,
   (b) a priming layer on the substrate, and
   (c) a resin layer on the priming layer, wherein the resin layer is at least 2 microns thick and comprises a terpolymer resin of average molecular weight in the range 1,000 to 100,000 and which contains 60 to 98 wt% vinyl chloride, 2 to 20 wt% vinyl acetate and up to 20 wt% of a termonomer which is a hydroxyl-containing alkyl acrylate or a methacrylate where the alkyl group contains 1 to 6 carbons.

3. An assembly adapted to receive a photopolymerizable material in the production of a relief printing plate which comprises
   (a) a polymeric substrate,
   (b) a priming layer on the substrate, and
   (c) a resin layer on the priming layer, wherein the resin layer is at least 2 microns thick and comprises a terpolymer resin of average molecular weight in the range 1,000 to 100,000 and which contains 60 to 98 wt % vinyl chloride, 2 to 20 wt % vinyl acetate and a termonomer up to 20 wt % and wherein the priming layer contains a vinyl chloride-vinyl acetate copolymer of greater molecular weight than that of the terpolymer in the resin layer.

4. An assembly adapted to receive a photopolymerizable material in the production of a relief printing plate which comprises
   (a) a polymeric substrate,
   (b) a priming layer on the substrate, and
   (c) a resin layer on the priming layer, wherein the resin layer is at least 2 microns thick and comprises a terpolymer resin of average molecular weight in the range 1,000 to 100,000 and which contains 60 to 98 wt % vinyl chloride, 2 to 20 wt % vinyl acetate and a termonomer up to 20 wt % and a particulate filler.

* * * * *